United States Patent [19]

Jarwala et al.

[11] Patent Number: 5,029,166

[45] Date of Patent: Jul. 2, 1991

[54] METHOD AND APPARATUS FOR TESTING CIRCUIT BOARDS

[75] Inventors: Najmi T. Jarwala, Plainsboro, N.J.; Chi W. Yau, Holland, Pa.

[73] Assignee: AT&T Bell Laboratories, Murray Hill, N.J.

[21] Appl. No.: 359,679

[22] Filed: May 31, 1989

[51] Int. Cl.⁵ ............................................. G06F 11/00
[52] U.S. Cl. .................................. 371/22.1; 371/22.3; 371/22.5
[58] Field of Search ..................... 371/22.3, 22.1, 25.1, 371/23, 27, 15.1, 22.5; 324/158 R, 73.1

[56] References Cited

U.S. PATENT DOCUMENTS

| | | | |
|---|---|---|---|
| 3,772,595 | 11/1973 | DeWolf | 371/25.1 |
| 4,055,801 | 10/1977 | Pike | 371/25.1 |
| 4,397,021 | 8/1983 | Lloyd | 371/15.1 |
| 4,402,055 | 8/1983 | Lloyd | 371/22.1 X |
| 4,716,564 | 12/1987 | Hung | 371/27 |
| 4,727,545 | 2/1988 | Glackemeyer | 371/25.1 X |

OTHER PUBLICATIONS

C. Gloster, "Boundry Scan With Built-In Self-Test", IEEE Design & Test, 2/1989, pp. 36–44.
R. Van Riessen, "An Architecture With Boundary Scan", IEEE Design & Test, 2/1990, pp. 9–19.
L. Whetsel, "A Standard Test Bus & Boundry Scan Architecture", TI Tech. Journal, Jul.-Aug./1988, pp. 48–59.
"Boundary-Scan Technique Targets Board-Level Testability", Computer Design, 10/1987, pp. 47 & 49.
"Testing and Diagnosis of Interconnects Using Boundary Scan Architecture", A. Hassa J. Rajski, and V. K. Agarwal, IEEE 1988 International Test Conference, Paper 7.1 pp. 126–137 (1988).
"Interconnect Testing with Boundary Scan", P. T. Wagner, IEEE 1987 International Test Conference, Paper 2.2, pp. 52–57 (1987).
"Electronic Chip-In-Place Test", P. Goel and M. T. McMahon, 1982 IEEE Test Conference, Paper 3.6, pp. 83–89 (1982).
"JTAG Boundry Scan Architecture Standard Proposal," Version 2.0, Joint Test Action Group, Mar. 30, 1988.
P. H. Bardell, W. H. McAnney, and J. Savir, *Built-In Test for VLSI: Pseudorandom Techniques*, John Wiley & Sons, 1987, p. 66.

*Primary Examiner*—Joseph Ruggiero
*Assistant Examiner*—Robert W. Beausoliel
*Attorney, Agent, or Firm*—Robert B. Levy

[57] ABSTRACT

A test system (10) is associated with a chain of circuits (12) on a circuit board (13) for testing the interconnections (11) linking the circuits in the chain as well as for testing the interconnections linking them to those on other boards. The test system includes a controller (22) for generating a test signal and for capturing a response signal generated by the associated chain of circuits in response to the test signal. The controller (22) also generates a flow control signal which controls a network (24) that routes the test signals from the controller, or from a first other test system, to the associated chain of circuits (12). In accordance with the flow control signal, the network (24) also serves to route the response signal from the associated chain of circuits (12) to the controller (22) or to a second other test system. By selectively routing the test and response signals, the network (24) in each test system (10) allows individual testing of each associated chain of circuits or, alternatively, permits the chains of circuits on several boards to be effectively interconnected for testing.

21 Claims, 6 Drawing Sheets

UNI-RING TRANSCEIVER

MULTI RING MODE

UNI-RING BOARD BYPASS MODE

UNI-RING CONTROLLER BYPASS MODE

METHOD AND APPARATUS FOR TESTING CIRCUIT BOARDS

TECHNICAL FIELD

This invention relates generally to a system, and a method of operating the same, for testing a set of interconnections linking a set of integrated circuits on a circuit board, and for testing the interconnections linking a set of circuit boards in a system.

BACKGROUND OF THE INVENTION

Presently, there is a trend towards smaller electronic components which has resulted in higher component density and greater circuit complexity on a given-sized circuit board. The increase in circuit complexity has increased the difficulty of accomplishing in-circuit testing by physically accessing the circuits with a test fixture so that the response of the circuits to an external stimulus can be sensed. Indeed, as surface-mounted components (i.e., components which are mounted on a major surface of the circuit board) proliferate, physical access to the circuits on the board by traditional test fixtures may become impossible. For these reasons, much effort has been devoted to developing alternative testing techniques.

Recently, a testing technique known as "boundary scan" has gained prominence as an alternative to traditional in-circuit testing by physically accessing the board through a test fixture. The boundary scan testing technique, as described in greater detail below, is embodied in a detailed specification (Version 2.0) authored by an international standards committee known as the Joint Test Action Group (JTAG). The JTAG boundary scan specification is herein incorporated by reference.

Accomplishing boundary scan testing requires that in addition to its normal application logic, each active component (e.g., integrated circuits) be fabricated with circuits known as "boundary scan cells" (BSCs) whose details are described in the JTAG standard. Each BSC is coupled between the application logic and one of the functional input and output pins of the integrated circuit such that each functional input and output pin is coupled to a separate one of a normal data input and normal data output, respectively, of the BSC. The term "pin" is being used to generically describe the signal-carrying conductive members (i.e., leads or pads) of the integrated circuit, irrespective of whether each member physically resembles a pin, or instead, takes the form of a metallized pad.

During normal operation of the integrated circuit, the signal applied to each functional input pin passes through the corresponding BSC and then into the application logic without effect. Similarly, signals from the application logic pass through the corresponding BSCs to each separate functional output pin without effect. Thus, the normal operation of the integrated circuit remains unaffected by the BSCs.

In addition to its normal data input and output, each BSC has a test data input and test data output connected so that each bit of a test vector applied to the test data input is serially shifted to the test data output of the BSC during operation thereof in a test mode. Also, the test data input of each BSC is linked to its normal data output so the test vector bit, shifted into the BSC during testing, can be applied to its normal data output. Within each integrated circuit, the BSCs are daisy chained such that a first and last one of the BSCs have their test data input and test data output coupled to a test data input port and test data output port, respectively, of the integrated circuit. The test data input and test data output of every remaining BSC is connected to the test data output and test data input, respectively, of each of a pair of adjacent BSCs to establish a serial ring or chain.

Just as the individual BSCs within each integrated circuit have their test data inputs and outputs linked in daisy-chain fashion, the integrated circuits on the circuit board are likewise connected. In other words, a first and last one of the integrated circuits have their test data input port and test data output port coupled to a test data input port and output port, respectively, on the circuit board. The test data input and test data output of each remaining integrated circuit is connected to the test data output port and test data input port, respectively, of a separate one of a pair of adjacent integrated circuits to form a serially connected chain.

Boundary scan testing is initiated by shifting successive bits (i.e., a "1" or "0") of a test vector into the test data input port of the first integrated circuit in the chain. The shifting continues until each successive bit is shifted from BSC to BSC within each integrated circuit, and from circuit to circuit within the boundary scan chain. Upon completion of the shifting operation, a successive one of the test vector bits will remain at the test data input of a separate one of the BSCs in each integrated circuit in the chain. Thereafter, the test vector bit at the test data input of each BSC is applied to the BSC's normal data output.

Next, the test vector bit at the normal data output of each BSC is applied to a net (i.e., a circuit path) connecting the output pin of the circuit associated with this BSC to an input pin of another integrated circuit in the boundary scan chain. Once the test vector bit is applied to the net, the bit is then input to the normal data input of each BSC coupled through the net to the output pin. Finally, the vector bits are then shifted out of the BSCs in the boundary scan chain.

Defects, if any, in the nets connecting the components can be discerned by comparing the vector shifted out of the chain of BSCs to the one originally shifted into the chain at the outset of testing. In particular, a defect (such as a short or open) in a net linking an output pin of one integrated circuit to the input pin of another in the chain will cause the corresponding BSCs coupled to pins to shift out different test vector bits. Thus, by comparing the test vector bits shifted out by the two BSCs linked by a particular net, the integrity of the net can be determined.

From the above discussion, verification of the nets connecting the integrated circuits on a single circuit board requires that the test vector bits be shifted through each of the BSCs in the integrated circuits in the boundary scan chain. To verify the integrity of the interconnections between two or more circuit boards via a backplane, the test vector bits must be shifted through a boundary scan chain comprised of the BSCs in the integrated circuits on each of the interconnected boards. Presently, there is no known boundary scan architecture which affords the ability to selectively test a boundary scan chain comprised of the integrated circuits on either a single board or those on several boards. In the past, selective testing of the integrity of the nets either on a single circuit board or those on two or more boards required that all the integrated circuits in the system be connected in a single large boundary scan chain, which makes testing of the nets on a single board very cumbersome.

Therefore, there is need for a boundary scan architecture which allows for efficient testing of a boundary scan chain comprised of the integrated circuits on either a single circuit board, or those on several boards.

There is another problem incurred during boundary scan testing which arises from the fact that many integrated circuits often have functional pins which may serve either as an input or an output, or alternatively, appear as a very high impedance. Such pins are usually each supplied, through a tri-state gate, with input/output signals from an application logic, as passed via an associated BSC (hereinafter referred to as an "input-/output" BSC). Each tri-state gate is controlled by a control signal from the application logic, which passes to the gate via a separate BSC, referred to as a "control-type" BSC. Both the control-type and input/output-type BSCs are identical in construction. For ease of discussion, those functional pins which are coupled to a tri-state gate will hereinafter be referred to as "tri-state" pins.

Oftentimes, a tri-state pin of one integrated circuit is coupled in parallel with a tri-state pin of another integrated circuit. This can lead to potential conflict between the integrated circuits if, during boundary scan testing, the tri-state pin of one circuit is driven to a logic low level at the same time the pin on the other is at a logic high level. Presently, this problem is avoided by only applying a set of test vectors whose bits are selected in advance such that the bits, when shifted into the control BSCs, generate no conflicts. The disadvantage of this approach is that only deterministic test vectors (those established in advance of testing) can be used, eliminating the possible use of vectors generated during testing in accordance with one or more algorithms which is sometimes advantageous.

Thus, there is a need for a technique which allows for algorithmically generated, pseudorandom, as well as deterministic, test vectors to be input during boundary scan testing without conflicts.

SUMMARY OF THE INVENTION

Briefly, in accordance with the invention, a test system is provided for accomplishing boundary scan testing of a chain of integrated circuits on either a single circuit board, or on two or more interconnected boards. The system includes a controller, which is associated with a boundary scan chain of integrated circuits on a circuit board, for generating at least one test vector for input to the circuit chain and for capturing a response signal (typically a vector shifted out of the chain) following receipt of the test vector. In addition to generating the test vector and capturing the shifted-out vector, the controller also generates at least one flow control signal for controlling the passage of the test vector to, and the shifted-out vector from, the chain of integrated circuits. The flow control signal controls a configurable network comprised of a plurality of logic devices. In response to the flow control signal, the configurable network selectively passes a test vector to the chain of integrated circuits on the circuit board from the controller associated therewith, or from the controller of a test system associated with another chain of integrated circuits on another board. The network also selectively passes the shifted-out vector from the boundary scan chain of integrated circuits to the associated controller or the controller of a test system associated with yet another boundary scan integrated circuit chain, in response to the flow control signals.

The ability of the configurable network to pass test vectors from, and the shifted-out test vector to, a test system other than the one associated with the chain of integrated circuits allows the chain of circuits on one circuit board to be daisy chained with those on one or more other boards. In this way, the integrity of the nets connecting two or more boards can be tested. Alternatively, by configuring the network so that the chain of integrated circuits receives test vectors from, and passes the shifted-out vector to, the controller associated therewith, the net connecting the integrated circuits on the board can be efficiently tested.

In accordance with another aspect of the invention, a system is provided for supplying test vectors to a chain of serially connected elements (e.g., the boundary scan cells in a chain of integrated circuits) to avoid potential conflicts during testing. The system comprises a first memory which stores a map of the elements, identifying those which are in potential conflict with each other. The output of the first memory is supplied to a control gate (e.g., a multiplexer) which passes the signals applied to a selected one of its first and second inputs in accordance with the signal from the first memory. The first input of the control gate is supplied with a signal from an automatic test pattern generator which generates test vectors in accordance with at least one predefined algorithm. The second input of the control gate is supplied from a second memory with a test vector whose bits are selected so that when each is input to separate one of the elements in potential conflict with each other, no conflict in fact occurs.

During operation, the control gate passes an individual bit of the test vector generated by the automatic test pattern generator to a separate one of the test elements if the element is identified by the first memory as not being in potential conflict with any other. If the test element is identified as one which is in potential conflict with another, then the control gate passes to the test element the individual bit of the test vector stored in the second memory, whose bits are selected so that no actual conflict occurs.

By providing a system map of the elements, and by using the identity of those in potential conflict with each other to assure that only "safe" or non-conflicting test vector bits are supplied thereto, possible damage to the test elements is avoided. At the same time, those elements not in potential conflict with each other can be supplied with bits of an algorithmically generated test vector which is often desirable.

DETAILED DESCRIPTION

General Overview

Figure 1:
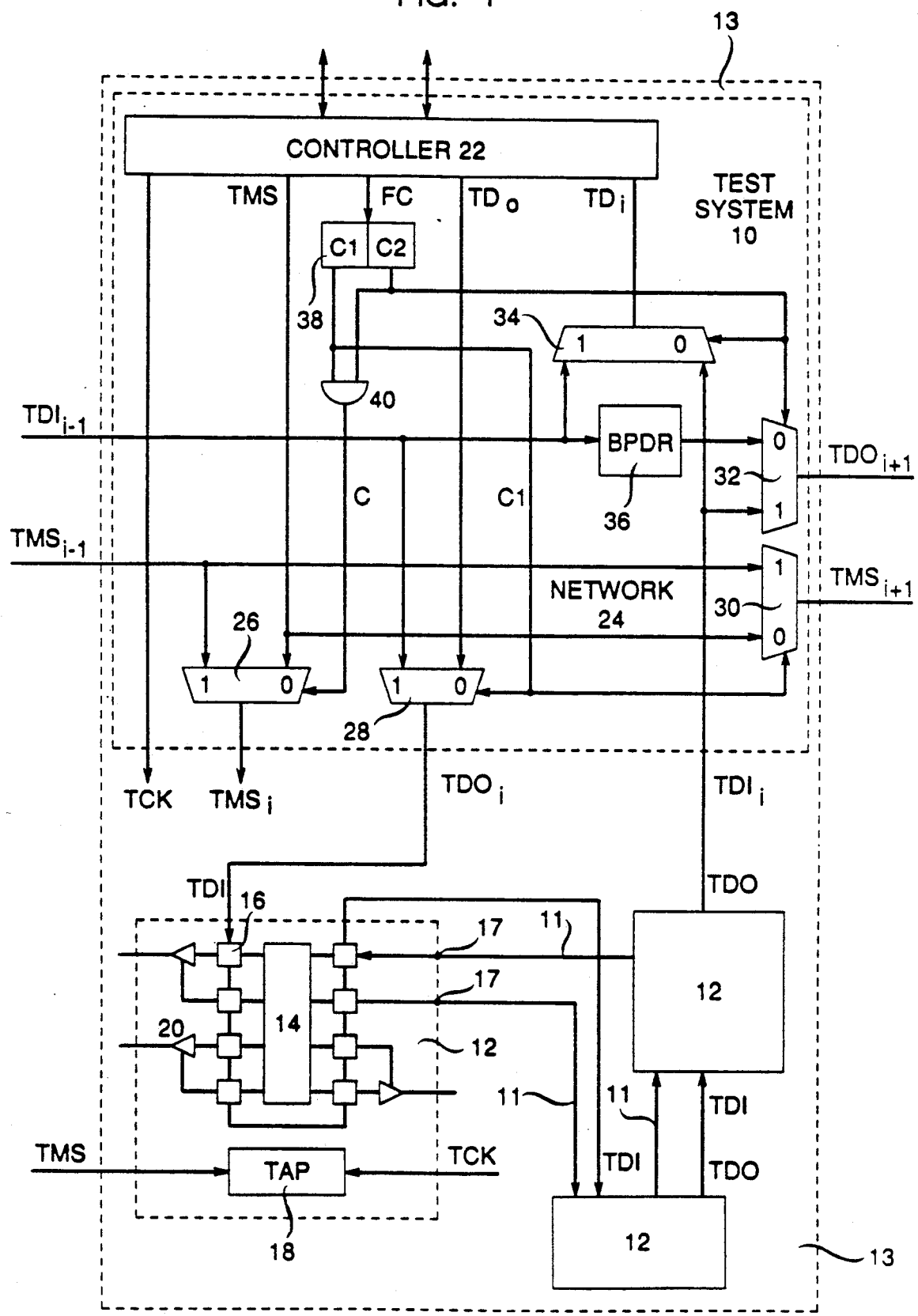
FIG. 1 illustrates a block schematic diagram of a test system in accordance with a preferred embodiment of the invention.

FIG. 1 shows a block diagram of a test system 10 taught by the invention, for accomplishing boundary scan testing of a set of interconnections 11 ("nets") which electrically link two or more "active" components 12 on a circuit board 13. Each active component 12 takes the form of an integrated circuit comprised of an application logic 14 (usually a plurality of interconnected gates (not shown)) which establishes the function of the circuit. In addition to the application logic 14, each integrated circuit 12 also includes a set of boundary scan cells (BSCs) 16 which enable boundary scan testing of the nets 11 in the manner described below. The structure of each BSC 16 is described in detail in the JTAG 2.0 standard incorporated by reference herein.

Within each integrated circuit 12, there is a BSC 16 coupled between the application logic 14 and a separate one of the functional input and output members or pins 17 of the circuit, some of which are linked to the pins on other circuits by the nets 11. Each BSC 16 is coupled such that an input signal is received at its normal data input from either the application logic 14 or from an input pin 17 and is shifted to the BSC's normal data output for passage to an output pin or the application logic, respectively. During normal operation of the integrated circuits 12, signals pass through each of the BSCs 16 between the application logic 14 and a separate one of the input and output pins 17 with no adverse effects.

The BSCs 16 described above pass input/output signals to or from the application logic 14, and for this reason, are described as I/O BSCs. In addition to the I/O BSCs 16, each integrated circuit 12 may contain additional "control BSCs." Each of the control BSCs 16 typically has its normal data input coupled to the application logic 14 and its normal data output coupled to the control input of a tri-state gate 20 interposed between an I/O BSC and a separate one of the pins 17. During normal operation, each control BSC 16 passes control signals from the application logic 14 to the tri-state gate 20 without adverse effect so the gate can control the state of the pin 17 to which it is connected.

In addition to its normal data input and output, each I/O and each control type BSC 16 has a test data input (TDI) and a test data output (TDO) (not shown). The TDO and TDI of the BSCs 16 are coupled such that a first and last one of the BSCs have their TDI and TDO coupled to a TDI and TDO port, respectively, on the integrated circuit 12. The other BSCs 16 in each integrated circuit 12 have their TDI and TDO coupled to the TDO and TDI, respectively, of a separate one of a pair of adjacent BSCs in a daisy-chain fashion to form a serial scan path or chain.

The integrated circuits 12 have their TDI and TDO ports daisy chained in the same way the BSCs 16 have their individual TDIs and TDOs daisy chained. The first and last one of the integrated circuits 12 on the circuit board 13 have their TDI and TDO ports coupled to a $TDO_i$ output and $TDI_i$ input, respectively, of the test system 10. Each of the other integrated circuits 12 has its TDI and TDO port coupled to the TDO and TDI port, respectively, of a separate one of a pair of adjacent integrated circuits in a serial chain.

The I/O and control BSCs 16 within each integrated circuit 12 are controlled by a test access port (TAP) controller 18 which is responsive to a test mode select (TMS) signal produced by the test system 10 at its $TMS_i$ output. Like the BSCs 16, the details of the TAP 18 are described in the JTAG 2.0 standard herein incorporated by reference.

In response to the TMS signal from the test system 10, the TAP controller 18 causes the integrated circuit 12 to operate in a test mode by causing the BSCs 16 within the integrated circuits in the chain to pass successive bits of a test vector $(TD_o)$ supplied from the test system 10 and applied to the TDI of the first circuit 12 in the chain during testing. It should be understood that $TD_o$ refers to the test vector applied to the TDI input of the first circuit 12 in the chain. The bits of the test vector are sequentially shifted through the BSCs 16 so that a successive one of the bits remains at each BSC in the chain.

In further response to the TMS signal, each I/O BSC 16, which has its normal data output coupled to a functional output pin 17 of each integrated circuit 12, applies its retained bit onto the net 11 coupled to the output pin. The test vector bit on the net 11 is thereafter applied to the corresponding functional input pin 17 of the integrated circuit 12 coupled to the other end of the net, thus "updating" the circuit. The test vector bit applied in this way to each functional input pin 17 of an integrated circuit 12 is then captured by the I/O BSC 16 coupled thereto, supplanting the test vector bit previously retained by the BSC. The test vector bits retained by the control and I/O BSCs 16 in each of the integrated circuits 12 in the boundary scan chain are then successively shifted out of the BSCs so that a response signal, in the form of a vector $TD_i$, thus appears at the TDO of the last integrated circuit in the chain.

By comparing selected bits of the $TD_i$ vector shifted out from the TDO of the last integrated circuit 12 in the chain to selected bits of the vector $TD_o$ shifted into the TDI input first circuit in the chain, the integrity of the nets 11 can be determined. If the net 11 linking the functional input and output pins 17 of a pair of integrated circuits 12 in the boundary scan chain is not otherwise shorted or open, then the test vector bit associated with each of the pair of BSCs 16 coupled to opposite ends of the net should be the same. Thus, a deviation in the test vector bit associated with each such pair of BSCs 16 represents a defect in the corresponding net 11.

Details of the Test System 10

Having provided a general overview of the principle of boundary scan testing of the nets 11, the details of the test system 10 will now be described. As best seen in FIG. 1, the test system 10 comprises a controller 22 which will be described in greater detail in FIG. 2. For present purposes, it is sufficient to understand that the controller 22 functions to produce successive test vectors $TD_o$ for input to the TDI input of the first integrated circuit 12 in the boundary scan chain. The controller 22 also functions to capture each vector $(TD_i)$ which is shifted out of the TDO of the last integrated circuit 12 in the chain during testing. Further, the controller 22 generates a test mode (TMS) signal for controlling the TAP controller 18 in each integrated circuit 12. Additionally, the controller 22 generates two other signals, a test clock signal (TCK) for input to each TAP controller 18 to synchronize its operation, and a flow control signal (FC) to control the flow of signals in a reconfigurable network 24.

Preferably, the network 24 includes five multiplexers 26–34, each having a first input and a second input, labeled "0" and "1", respectively. Each of the multiplexers 26–34 is responsive to a control signal derived from the FC signal in a manner described below. Depending on whether the control signal supplied thereto is at a logical low level or a logical high level, each of the multiplexers 26–34 selectively passes the signal at its first or second input, respectively, to the output thereof. The multiplexer 26 is supplied at its first and second inputs with the TMS signal from the controller 22, and with a TMS signal supplied to a test mode select ($TMS_{i-1}$) input of the test system 10, respectively. The multiplexer 26 is responsive to a control signal C which is derived from the FC signal. When the signal C is at a logic low state, the multiplexer 26 passes the TMS signal from the controller 22 to a first test mode select signal output ($TMS_i$) of the test system 10, which is coupled to the test mode select (TMS) signal input of the TAP controller 18 in each integrated circuit 12. Conversely, when the control signal C is at logic high level, the test mode select signal at the $TMS_{i-1}$ of the test system 10 input is passed by the multiplexer 26 to the $TMS_i$ output of the test system 10.

The multiplexer 28 is supplied at its first and second inputs with the test vector $TD_o$ generated by the controller 22, and with a test vector supplied to a test data input $TDI_{i-1}$ of the test system 10, respectively. The multiplexer 28 is responsive to a control signal C1 derived from the FC signal, and when the signal C1 is at a logic low level, the multiplexer 28 passes the signal at its first input to a first test data output ($TDI_i$) of the test system 10, which is coupled to the TDI of the first integrated circuit 12 in the boundary scan chain. Conversely, when the signal C1 is at a logic high level, the vector present at the $TDI_{i-1}$ input of the test system 10 is passed to the test system's $TDO_i$ output.

The multiplexer 30 is supplied at its first and second inputs with the TMS signal generated by the controller 22, and with the TMS signal supplied to the $TMS_{i-1}$ input of the test system 10. The multiplexer 30 is responsive to the control signal C1, and, when the signal is at a logic low level, the multiplexer passes the TMS signal of the controller 22 to a second test mode select output $TMS_{i+1}$ of the test system 10. When the control signal C1 is at a logic high level, the multiplexer 30 passes the TMS signal at the $TMS_{i-1}$ input of the test system 10 to its $TMS_{i+1}$ output.

The multiplexer 32 has a first input coupled to the output of a bypass data register 36 whose input is coupled to the $TDI_{i-1}$ input of the test system 10. The second input of the multiplexer 32 is coupled to the $TDI_i$ input of the test system which is supplied with the test vector $TD_i$ shifted out of the chain of integrated circuits 12 during boundary scan testing. The multiplexer 32 is responsive to the state of a control signal C2 derived from the flow control signal FC, and when the C2 signal is at a logic low level, the multiplexer 32 passes the vector at the $TDI_{i-1}$ input of the test system 10 to the $TDO_{i+1}$ output thereof. When the C2 signal is at a logic high level, the test vector $TD_i$ shifted out of the chain of integrated circuits 12 is passed by the multiplexer 32 to the $TDO_{i+1}$ output of the test system 10.

While it would be possible to pass the vector received at the $TDI_{i-1}$ input of the test system 10 directly (bit by bit) to the first input of the multiplexer 32, thereby eliminating the BPDR 36, there is a distinct advantage in providing the register. By interposing the bypass data register 36 between the $TDI_{i-1}$ input of the test system 10 and the first input of the multiplexer 32, the test vector bits received at the $TDI_{i-1}$ input will be synchronized when passed individually by the multiplexer to the $TDO_{i+1}$ output because the register is clocked in response to the TCK clock signal. To accomplish the task of synchronizing the test vector bits passed from the $TDI_{i-1}$ input to the $TDO_{i+1}$ output of the test system 10, the BPDR 36 must be at least one bit wide. In practice, the BPDR 36 is selected to hold at least two bits. These two bits are initialized at a "1" and "0", respectively, when the network 24 is placed in the "uniring board bypass" mode of operation described later. This enables the integrity of the $TDO_{i+1}-TDI_{i-1}$ path between multiple circuit boards 13 to be verified.

The multiplexer 34 has its first and second inputs coupled to the $TDI_i$ and $TDI_{i-1}$ inputs, respectively, of the test system 10. The multiplexer 34 is responsive to the control signal C2, and when the control signal is at a logic low state, the multiplexer passes the vector at the $TDI_i$ input of the test system 10 to the controller 22 for capture thereby. Conversely, when the C2 signal is at a logic high level, the test vector signal at the $TDI_{i-1}$ input is transmitted by the multiplexer 34 to the controller 22.

The control signals C, C1 and C2 are derived from the FC signal produced by the controller 22 in the following manner. In practice, the FC signal is comprised of two bits, c1 and c2, which are stored in each of two locations in a two-bit register 38. The bits c1 and c2 are output from the register 38 as the C1 and C2 signals. The control signal C is derived by ANDing the bits c1 and c2 at an AND gate 40.

Figure 8:
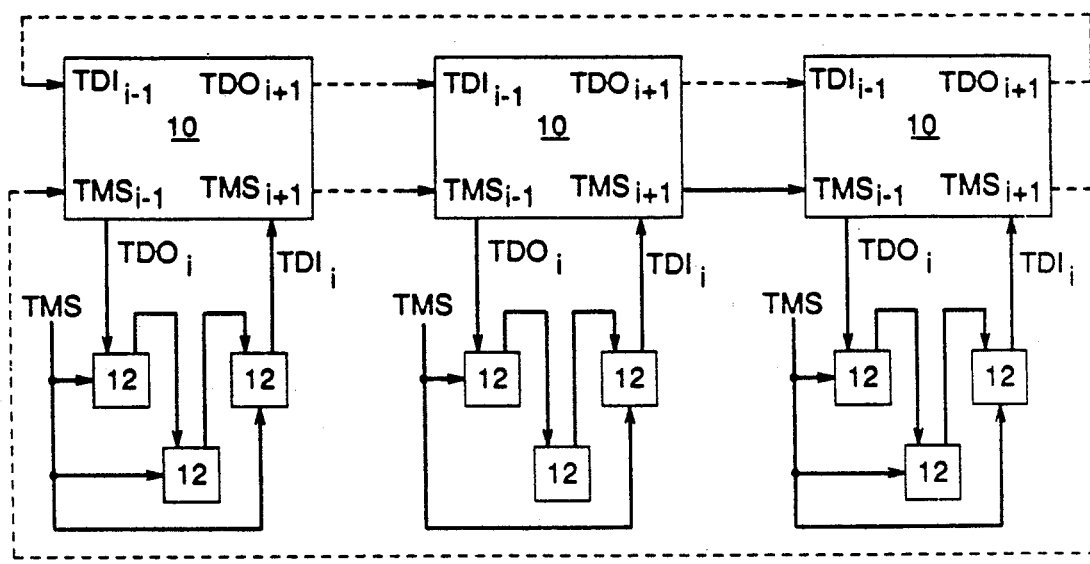
FIG. 8 shows a plurality of the test systems of FIG. 1 connected in a daisy-chain fashion so as to operate in a multi-ring mode.

As described above, the network 24 selectively passes the TMS signal and the $TD_o$ vector, received either from the controller 22 or from a separate one of the $TMS_{i-1}$ and $TDI_{i-1}$ inputs, respectively, of the test system 10 to the integrated circuits 12 in the boundary scan chain. In addition, the network 24 selectively passes the TMS signal and the $TD_i$ vector, received either from the controller 22 or from a separate one of the $TMS_{i-1}$ and $TDI_{i-1}$ inputs, respectively, of the test system 10 to its $TMS_{i+1}$ and $TDO_{i+1}$ outputs, respectively. Referring to FIG. 8, the test system 10 associated with a particular chain of integrated circuits 12, is daisy chained with one or more others such that the $TDI_{i-1}$ and $TMS_{i-1}$ inputs of each test system are coupled to the $TDO_{i+1}$ and $TMS_{i+1}$ outputs, respectively, of another immediately preceding it in the chain.

As will become better understood hereinafter, by selectively controlling the network 24 (see FIG. 1) within each test system 10, the TMS signal produced by one test system can be passed to each of the others. Also, by selectively controlling the individual networks 24, the test vector $TD_i$ shifted out of a first chain of integrated circuits 12 can be transmitted to the next successive test system 10 in the chain for input as the test vector $TD_o$ to its associated chain of integrated circuits. In this way, the chain of integrated circuits 12 associated with each test system 10 can be effectively serially linked with those associated with one or more test systems to enable testing of the nets (not shown) linking the circuits in different chains.

Controller 22

Figure 2:
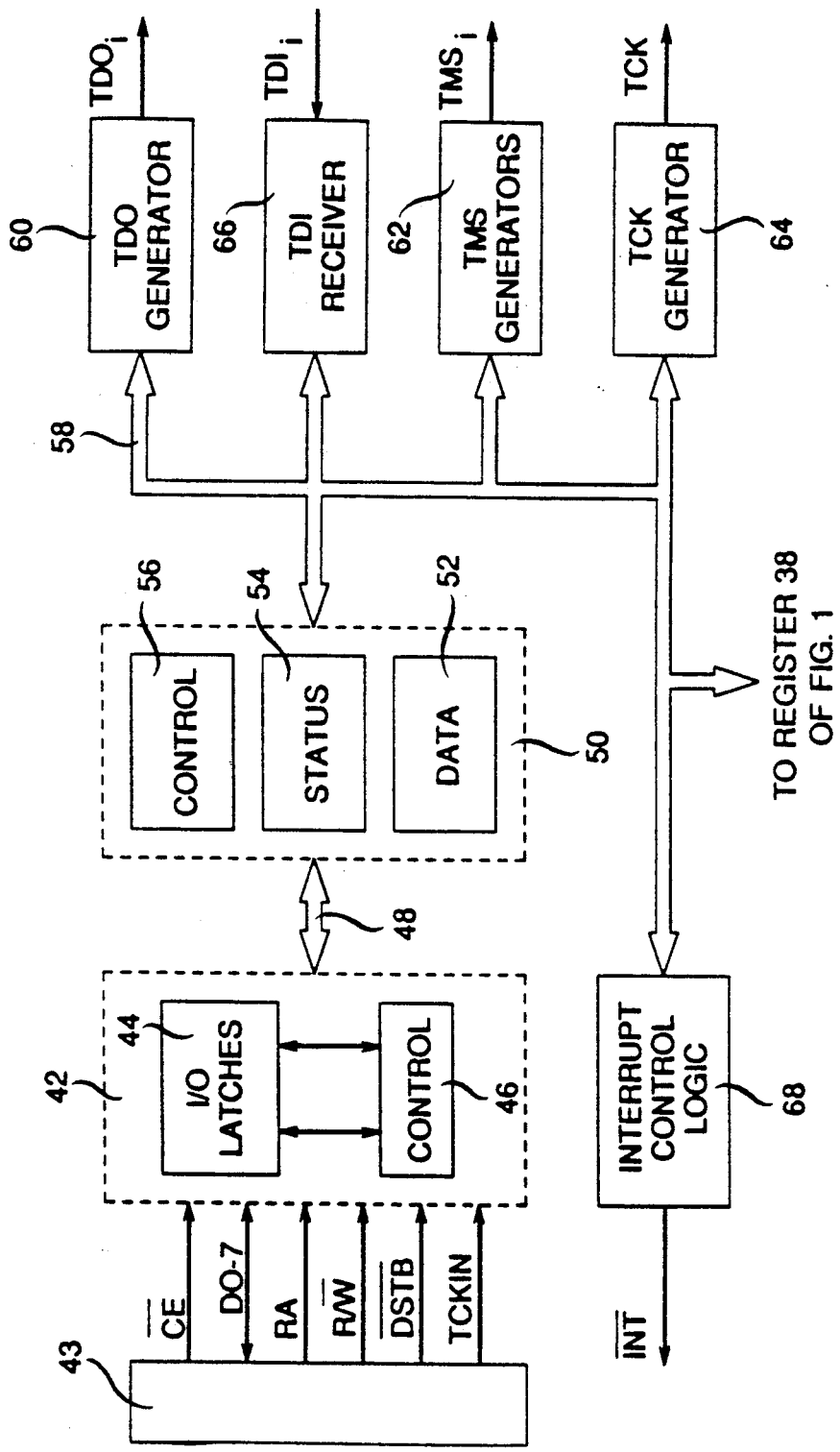
FIG. 2 is a block schematic diagram of a boundary scan controller comprising a portion of the test system of FIG. 1.

Referring now to FIG. 2, there is shown a block schematic diagram of the controller 22. In a preferred embodiment, the controller 22 includes a processor interface 42 through which data and control signals are received from, and transmitted to, an external test and diagnosis system 43, which, in practice, comprises a commercial test system as are known in the art. The interface 42 includes an input/output latch 44 which is controlled by a control circuit 46. The interface 42 is coupled to the external test and diagnosis system via a set of bi-directional data lines D0-7, typically eight in number, so that eight-bit data bytes can be communicated between them.

The interface 42 is coupled to the external test and diagnosis system to receive a chip enable ($\overline{CE}$) signal, a register address (RA) signal, a read/write (R/$\overline{W}$) signal, a data strobe ($\overline{DTSB}$) signal, and a test clock input (TCKIN) signal. The $\overline{CE}$ signal is comprised of a single binary bit which serves to enable the interface 42 when the bit is at a logic low level. The RA signal comprises a single binary bit which controls the addressing of the latches 44 by the external test and diagnosis system 43. The R/$\overline{W}$ signal is a single binary bit which indicates whether data is to be written to, or read from, the latch 44. The $\overline{DTSB}$ signal is a single bit which, when at a logic low level, alerts the interface 42 that valid data is present on the data lines D0-D7. The TCKIN signal is a single binary bit which is time-varying, and it is from this bit that the TCK signal is derived.

The interface 42 is coupled via a bus 48 to a register bank 50 containing three sets of registers 52, 54 and 56. The register 52 bears the label "data" because the register serves to store data (e.g., length of the boundary-scan chain etc. required for the operation of the controller 22). The register 54 bears the label "status" because the register stores status information, such as the status of certain interrupts. To this end, register 54 may also store an interrupt mask which serves to mask or otherwise obscure one or more of the interrupt bits so that only selected interrupt bits are "seen."

The register 56 is labeled as the "control" register because it stores information which controls the operation of the controller 22. For example the register 56 contains one or more binary data bits which control when the test vector $TD_o$ is shifted out to the chain of circuits 12 of FIG. 1 as well as when the vector $TD_i$ is shifted into the test system 10. Further, the control register 56 stores each of the pair of bits c1 and c2 which comprise the flow control signal FC.

A bus 58 serves to couple the register bank 50 to the register 38 of FIG. 1 as well as to a Test Data Output (TDO) signal generator 60, a TMS signal generator 62, a TCK signal generator 64, a Test Data Input (TDI) receiver 66, and an interrupt control logic circuit 68. The TDO generator 60, whose details will be described with respect to FIG. 3, produces the test vector $TD_o$ which is supplied to the circuits 12 in the boundary scan of FIG. 1. The TMS generator 62 typically takes the form of a special register which outputs test control information (stored in the register 56) to the chain of circuits 12 of FIG. 1 as the TMS signal.

The TCK generator 64 takes the form of a programmable divider which divides the TCKIN signal to generate the TCK signal. The TDI receiver 66 essentially comprises one or more random access memories which serve to store the test vector $TD_i$ received from the multiplexer 34 of FIG. 1. The interrupt control logic 68 typically comprises one or more logic gates (AND, OR NAND, etc) which are coupled to mask the interrupt information stored in the status register 54 so as to provide the external test and diagnosis system with an interrupt signal $\overline{INT}$.

TDO Signal Generator 60

Figure 3:
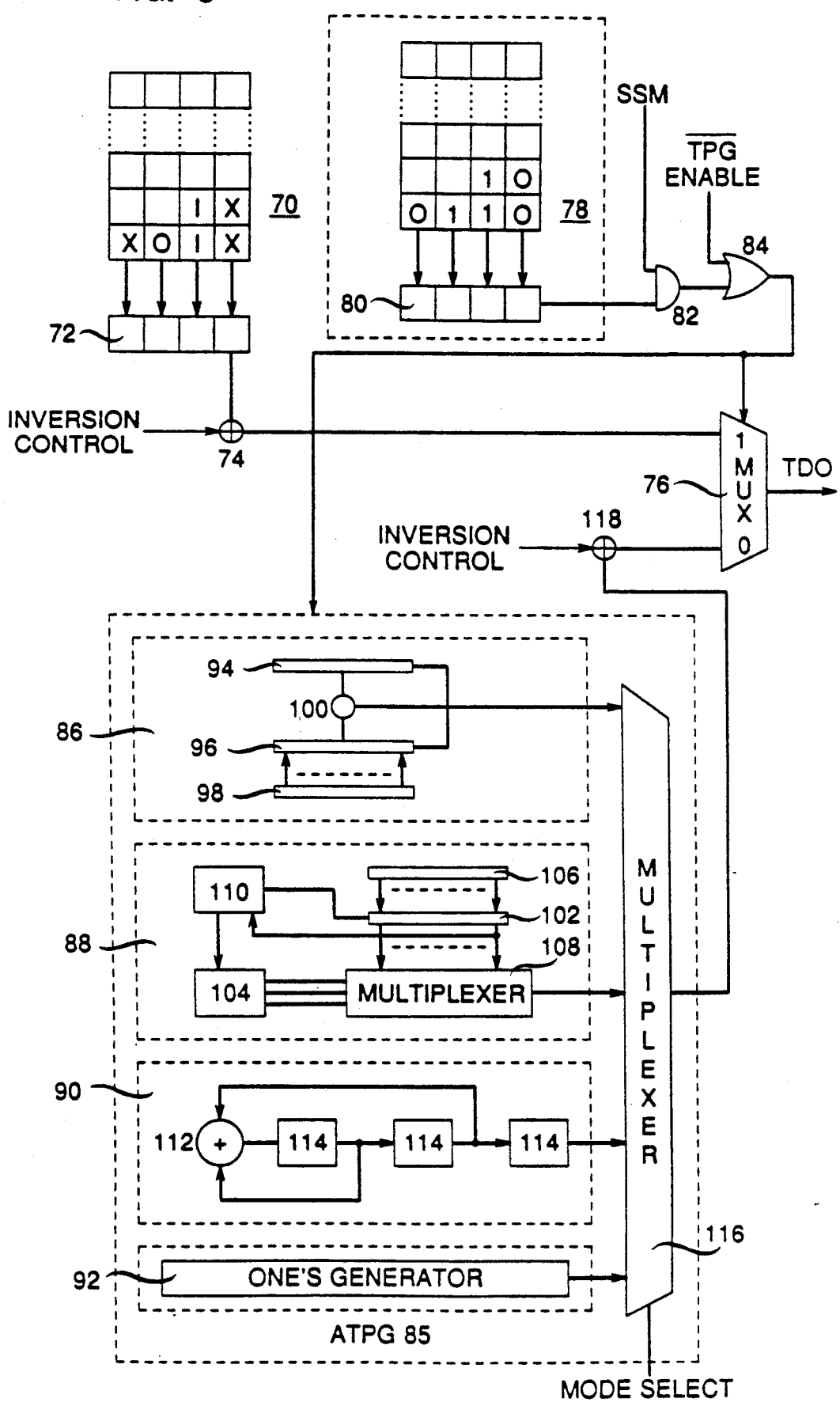
FIG. 3 illustrates a block schematic diagram of a test data output signal generator comprising an element of the boundary scan controller of FIG. 2.

Referring to FIG. 3, there is shown a schematic diagram of the test data output (TDO) signal generator 60 of FIG. 2, which, as will be explained below, serves to advantageously generate successive test vectors $TD_o$ which avoid any potential conflicts between the BSCs 16 of FIG. 1. As seen in FIG. 3, the TDO signal generator 60 comprises a first memory 70 which serves to store a set of vectors supplied by the external test and diagnosis measurement system 43. Each of the vectors stored in the memory 70 represents a test vector $TD_o$ whose bits are to be shifted into the BSCs 16 in the boundary scan chain of integrated circuits 12 of FIG. 1. The bits of each $TD_o$ vector stored in the memory 70 are carefully selected such that the particular bit shifted into, and retained by, each control BSC 16 which controls a corresponding tri-state gate 20 does not cause a conflict with another gate during testing. Such bits will either be a "1" or a zero as required. The remaining bits of each vector in the register 70 are represented by an x since their value is not of concern because such bits are in fact not actually shifted out to the BSCs 16. The memory 70 has its output coupled to a shift register 72 which serves to sequentially shift out each of the binary ones and zero's of each test vector in response to a clock signal, typically the TCK signal. The shifted-out bits are input to an inversion control unit 74, typically, a two-input exclusive OR gate whose output is coupled to the second or "1" input of a multiplexer 76.

Associated with the TDO signal generator 60 is a second memory 78 which is shown enclosed by a dotted line to indicate that the memory is not physically part of the test generator. In practice, the memory 78 is actually part of the TDI receiver 66 but is shared by the TDO signal generator 60. During selected intervals of operation of the test system 10, the memory 78 operates to store at least part of the shifted-out test vector $TD_i$ to retain it for input to the external test and diagnosis system 43. During other intervals, the memory 78 is loaded with data, in the form of a map, designating which of the BSCs 16 in each circuit 12 serves to control a corresponding tri-state gate 20. It is during such intervals that the memory 78 is shared by the TDO signal generator 60.

Within the "BSC map" stored within the memory 78, each "1" represents a BSC 16 which controls a corresponding tri-state gate 20 of FIG. 1. For these BSCs 16, the test vector bit retained thereby must be carefully selected to avoid a potential conflict. Conversely, each "0" represents an input/output BSC 16 which serves to pass data between the application logic 14 of the circuit 12 and its corresponding input/output pin 17.

The memory 78 has its output coupled to a shift register 80 which, in turn, has its output coupled to a first input of a two-input AND gate 82. The second input of the AND gate 82 is supplied with a control signal SSM which is at a logic high level during the intervals when the information is to be passed from the memory 78. The output of the AND gate 82 is OR'd at an OR gate 84 with a control signal $\overline{\text{TPG ENABLE}}$ whose function is to enable an automatic test pattern generator 85 described below.

The automatic test pattern generator 85 is configured to generate successive test vectors $TD_o$ in accordance with a particular algorithm. In a preferred embodiment, the generator 85 contains four separate modules, 86, 88, 90, and 92, each serving to generate successive test vectors $TD_o$ in accordance with a separate one of four different algorithms. The first module 86 serves to generate a set of "walking ones" vectors, that is, a matrix of vectors whose diagonal is comprised of all "ones" whereas the remaining bits are all "zeros". To generate such test vectors, the module 86 contains two counters 94 and 96 which cascaded in the manner shown. Both the counters 94 and 96 count down from a value N, where N is the desired number of nets 11 (FIG. 1) to be tested. The counter 96 is coupled to a buffer 98 which reloads the counter once it has counted down to zero. The outputs of the counters 94 and 96 are coupled to first and second inputs, respectively, of a comparator 100.

In operation, both counters 94 and 96 are initialized with the value N from the external test and diagnosis system. The value N is also stored in the buffer 98. Since the count of the counters 94 and 96 initially equals N, the comparator 100 outputs a "one." Thereafter, the counter 96 is decremented by one, and each time the counter is decremented, the comparator outputs a zero. Once the counter 96 has decremented to zero, the counter 94 is decremented to $N-1$. The counter 96 is then reloaded with N and then decremented again. The comparator will once again output a "one" only when the counters 96 and 94 are equal, which now occurs when each has counted down to $N-1$. Every other time, the comparator outputs a zero. As may now be appreciated, the comparator will only output a "one" when the counters 96 and 94 each count down to N, $N-1, N-2 \ldots N-N$ at the same time, which will yield a matrix of vectors whose diagonal will be all "ones."

The module 88 serves to generate a counting sequence of test vectors, that is, a set of successive test vectors which increase monotonically in value. To generate such a set of test vectors, the module 88 contains two countdown counters 102 and 104. The counter 102 has an associated buffer 106 which reloads the counter once it has been decremented to zero. The output of the counter 102 serves as the input to a multiplexer which is controlled by the output count of the counter 104. The output of the counter 102 is coupled to a detection logic circuit 110 which detects when the counter has counted to one in order to alert the counter 104 of this event so it may then start counting down.

In operation, the counter 102 is loaded with the value of N. The counter 104 is loaded with the value $\lceil \log(N+2) \rceil - 1$. Thereafter, the counter 102 is decremented, and when its count reaches one, the counter is re-initialized. At the same time, the detection logic 110 signals the counter 104 to count down. Since the output of the counter 104 is coupled to the control input of the multiplexer 108, the count of this counter determines which of the lines of the counter 102 are passed by the multiplexer along its output line. The counter 102 will count to N, $\lceil \log(N+2) \rceil$ times, a successive one of its $\lceil \log(N+2) \rceil$ lines is passed by the multiplexer 108, thus yielding a serialized counting sequence of vectors.

The module 90 serves to successively generate pseudorandom test vectors $TD_o$. o generate pseudorandom vectors, the module 90 contains a feedback polynomial circuit comprised of a multi-input, exclusive OR gate (EXOR) 112 whose inputs are each coupled to an output of a selected one of a set of flip-flops 114. The flip-flops 114 are cascaded (i.e., daisy chained) such that the input of a first one is coupled to the output of the EXOR gate 112 whereas the ouput of the last one serves as the output of the module 90. The remaining flip-flops 114 each have their input and output coupled to the output and input, respectively, of a separate one of an adjacent pair of flip-flops. A selected one of each of the flip-flops 114 has its output coupled to a separate one of the inputs of the EXOR gate 112.

In operation, when the flip-flops 114 are clocked (typically in response to the TCK signal), the last of the flip-flops in the chain produces a signal having a particular recursion relation depending on which of the flip-flops of the circuit has its output coupled to an input of the OR gate 112. By clocking the flip-flops 114 N times N successive bits, having a pseudorandom distribution will be obtained. For a further discussion of feedback polynomial circuits, reference should be had to the text *Built-In Test for VLSI: Pseudorandom Techniques*, by P. Bardell et al., John Wiley & Sons (1987) at page 66, which is herein incorporated by reference.

The last of the modules 92 serves to generate a test vector $TD_o$ comprised of all "ones." To generate such a vector, the module 92 may be configured of an inverter (not shown) whose input is supplied with a signal at a constant logic "low" level.

The output of each of the modules 86, 88, 90 and 92 is supplied to a separate one of the inputs of a multiplexer 116 which serves to selectively pass the signal at a separate one of its inputs to the multiplexer output in accordance with a mode select signal supplied to its control input from the external test and diagnosis system 43. The output of the multiplexer 116 is passed through an inversion control element 118, identical to the inversion control element 74, before being supplied to the second input of the multiplexer 76.

Operation of the test data generator 60 is controlled by the state of the SSM and $\overline{\text{TPG ENABLE}}$ signals which are generated by the external test and diagnosis system 43. When both the SSM signal and the bit of the test vector output from the memory 78 are at a logic high level, then the output of the AND gate 82 will be at a logic high level. As a result, the OR gate 84 outputs a logic high level signal that inhibits the automatic test pattern generator 86, and causes the output signal of the shift register 72 to pass through the multiplexer 76. In this way, the instant bit of the test vector $TD_o$ immediately output by the multiplexer 76 will be "safe," that is, it will not cause any potential conflicts among the BSCs 16 of FIG. 1. This same result is also achieved if the $\overline{\text{TPG ENABLE}}$ signal is also at a logic high level, notwithstanding the state of the output signal of the AND gate 82. Conversely, when both the output signal of the AND gate 82 and the $\overline{\text{TPG ENABLE}}$ signal are at a logic low level, then the automatic test pattern generator 85 is enabled. At the same time, the multiplexer 76 is enabled to pass the output signal of the automatic test pattern generator 85, rather than the output signal of the shift register 72. In this way, the instant bit of the test vector $TD_o$ output by the multiplexer 76 is generated by one of the four modules 86-92.

As may be appreciated, the state of the $\overline{\text{TPG ENABLE}}$ signal establishes whether the deterministic test vectors stored in the memory 70, or the vectors generated by the automatic test pattern generator 85, are output by the test generator 60. The state of the SSM signal determines whether the sequence of the vectors output by the automatic test pattern generator 85 is modified by instead substituting the information contained in the memory 78. The term SSM is an abbreviation for the phrase "scan sequence modified," which reflects the fact that the state of the SSM signal modifies the scan sequence of vectors produced by the automatic test pattern gnerator 85.

Overall Operation

Figure 4:
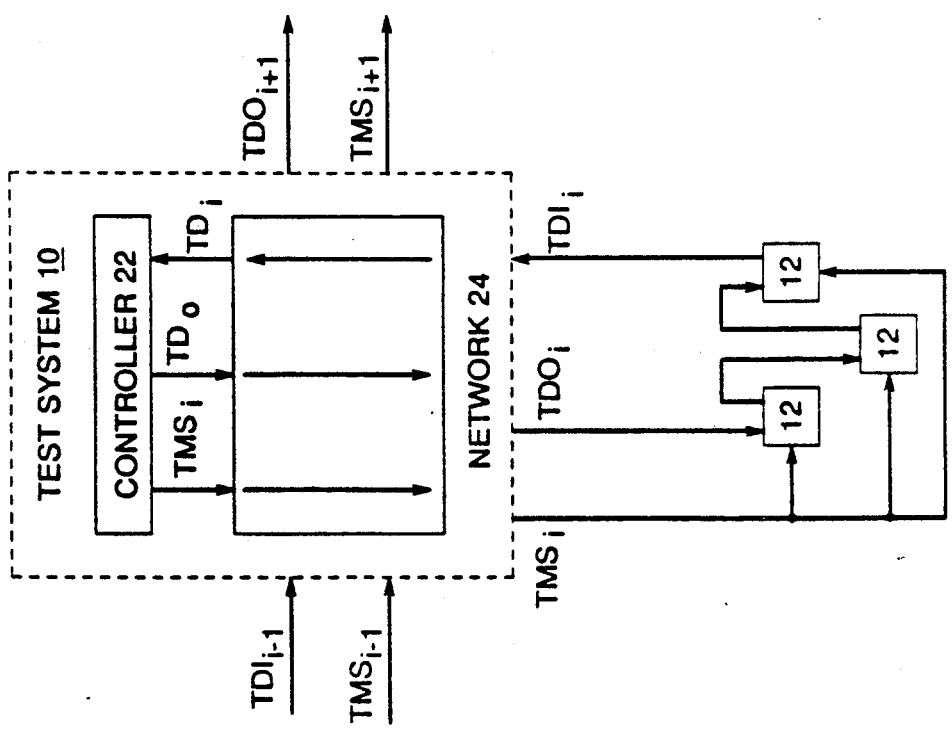

The overall operation of the test system 10 may best be understood by reference to FIGS. 4–7. Referring to FIG. 4, the test system 10 is shown operating in a "multi-ring" mode during which the TMS signal and $TD_o$ vector generated by the controller 22 are transmitted to the $TMS_i$ and $TDO_i$ outputs, respectively, of the test system 10 through the network 24. Also, during operation in the multi-ring mode, the vector $TD_i$, shifted out of the chain of circuits 12 and input to the $TD_i$ input of the test system 10, is transmitted by the network 24 to the controller 22 for capture thereby.

Referring to FIG. 1, in order for the test system 10 to operate in the multi-ring mode, each of the two bits c1 and c2 of the control signal FC is set by the controller 22 at a logic low level. In this way, the TMS signal and $TD_o$ vector produced by the controller 22 pass through the multiplexers 26 and 28, respectively, to the boundary scan chain of circuits 12 while the vector $TD_i$ shifted out of the component chain and received at the $TD_i$ input of the test system 10 passes to the controller 22.

As was discussed previously with respect to FIG. 8, each test system 10 associated with a particular boundary scan chain of integrated circuits 12 has its $TDO_{i-1}$ and $TMS_{i-1}$ inputs coupled to the $TDO_{i+1}$ and $TMS_{i+1}$ outputs, respectively, of an upstream test system. Conversely, the $TDO_{i+1}$ and $TMS_{i+1}$ outputs of each test system 10 are coupled to the $TDO_{i-1}$ and $TMS_{i-1}$ inputs, respectively, of the downstream test system. When each test system 10 operates in its multi-ring mode, the TMS signal and $TD_o$ vector received at the $TDI_{i-1}$ and $TMS_{i-1}$ inputs from its upstream neighbor are simply ignored. For this reason, the $TDI_{i-1}$ – $TDO_{i+1}$ connections are shown as dashed, rather than solid, lines. Rather, each test system 10 supplies its corresponding boundary scan chain of circuits 12 with the vector $TD_o$ and TMS signal from its own controller 22. At the same time, the test vector $TD_i$ shifted out of each chain of circuits 12 is captured by the controller 22 of the test system 10 associated with the chain.

Figure 5:
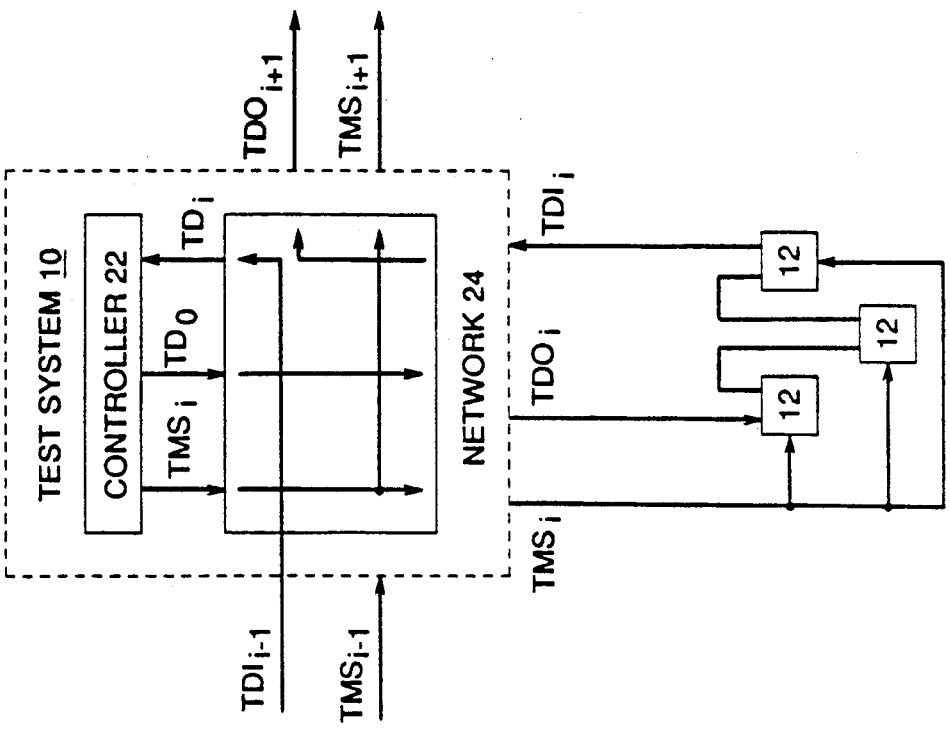
FIGS. 4-7 are block schematic diagrams of the test system of FIG. 1 illustrating its four different modes of operation.

Referring to FIG. 5, the test system 10 is shown operating in a "uniring transceiver" mode. When the test system 10 operates in this mode, the test vector $TD_i$ received at the $TDI_{i-1}$ input is transmitted through the network 24 to the controller 22 for capture. The TMS signal produced by the controller 22 is transmitted through the network 24 to the controller 22 for $TMS_i$ output for passage to the associated chain of circuits 12. The TMS signal is also transmitted to the $TMS_{i+1}$ output of the test system 10 for passage to the downstream test system. The $TD_o$ test vector produced by the controller 22 of the test system is transmitted through the network 24 to the $TDO_i$ output for passage to the chain of circuits 12, whereas the $TD_i$ vector shifted out of the circuit chain is transmitted through the network 24 to the $TDO_{i+1}$ output of the test system for receipt at the $TDI_{i-1}$ input of the downstream test system.

Referring to FIG. 1, to operate the test system 10 in the uni-ring mode, the bits c1 and c2 of the control dignal FC are set by the controller 22 at a logical low and logical high level, respectively. With the bits c1 and c2 at these logic levels, the multiplexer 34 passes the test data received at the $TDI_{i-1}$ input of the test system 10 from the upstream test system to the controller 22 while the mulitplexer 38 passes the $TD_o$ signal from the controller to the $TDO_i$ output. At the same time, the multiplexers 26 and 30 each pass the TMS signal produced by the controller 22 to the $TMS_i$ and the $TMS_{i+1}$ outputs, respectively, while the multiplexer 32 passes the shifted-out vector $TD_i$ from the chain of circuits 12 to the $TDO_{i+1}$ output of the test system 10.

Figure 9:
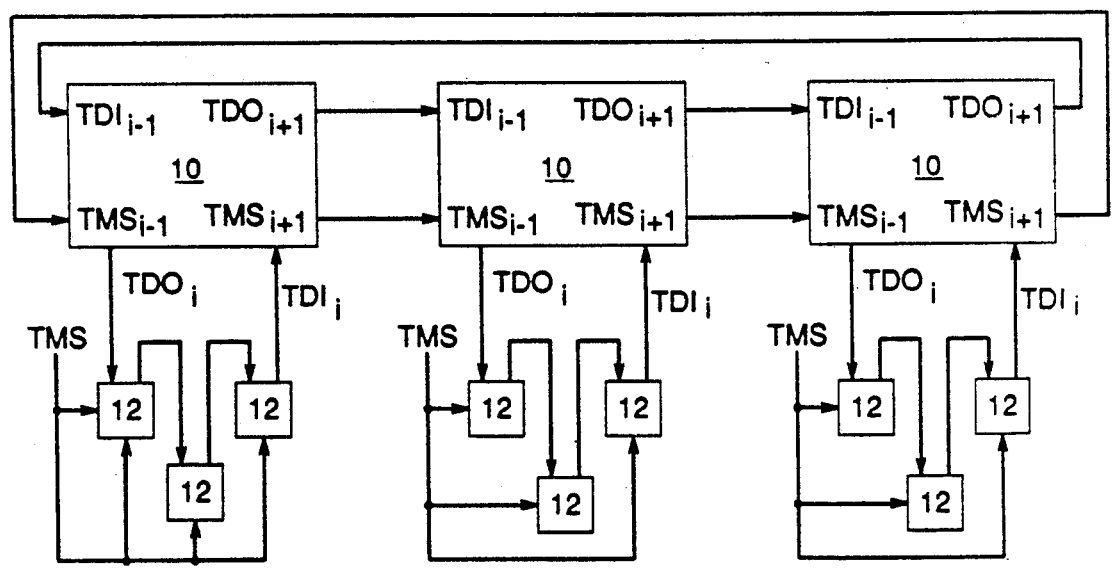
FIG. 9 shows a plurality of the test systems connected in daisy-chain fashion so as to operate in a uni-ring mode.

Referring to FIG. 5, when the test system 10 operates in the uni-ring transceiver mode, the controller 22 does not capture the $TD_i$ vector received from the boundary scan chain of circuits 12, but instead, captures the test vector received at the $TDI_{i-1}$ input of the test system 10. The test vector $TD_i$ shifted out of the chain of circuits 12 is transmitted not to the controller 22 of the test system 10, but to the test system downstream therefrom. Thus, in uni-ring transceiver mode, each test system 10 serves to pass the $TD_i$ vector shifted out of the boundary scan chain of integrated circuits 12 associated with the upstream test system to its boundary scan integrated circuit chain. Referring to FIG. 9, when one of the test systems 10 operates in the uni-ring transceiver mode while the others operate in the "controller bypass" mode described below, the boundary scan chain of integrated circuits 12 associated with each test system 10 can be effectively daisy chained with those of the other test systems to allow the interconnections between the chain of circuits to be boundary scan tested.

Figure 6:
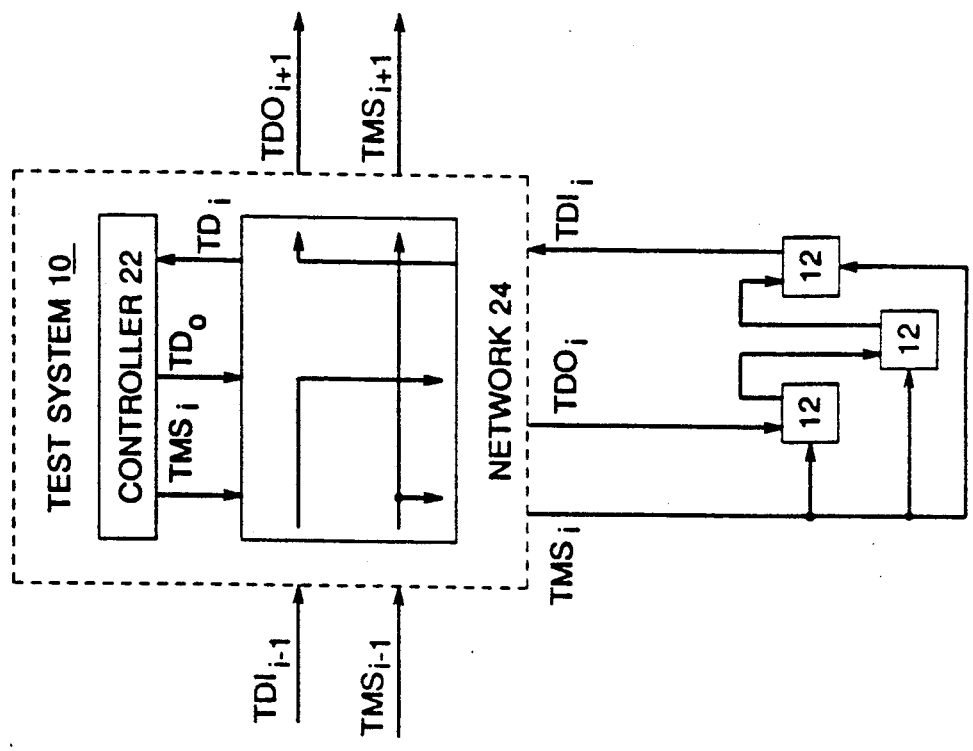

Referring now to FIG. 6, the test system 10 is shown operating in its "uni-ring controller bypass" mode. In this mode, the TMS signal received at the $TMS_{i-1}$ of the test system 10 from the upstream test system is transmitted through the network 24 to the $TMS_i$ and $TMS_{i+1}$ outputs for receipt by the chain of circuits 12 and by the downstream test system, respectively. The test vector received at the $TDI_{i-1}$ input of the test system 10 from the upstream test system is carried by the network 24 to the $TDO_i$ output for transmission to the boundary scan chain of integrated circuits 12. The test vector $TD_i$, shifted out of the boundary scan chain of integrated circuits 12 and supplied to the $TDI_i$, input of the test system 10, is transmitted by the network 24 to the $TDO_{i+1}$ output of the test system.

Referring to FIG. 1, to achieve operation of the test system 10 in the uni-ring bypass mode, the bits c1 and c2 of the control signal FC are both set by the controller 22 at a logical high level. With the bits c1 and c2 set at this level, the multiplexers 26 and 30 each pass the test mode select signal at the $TMS_{1-1}$ input to the $TMS_i$ and $TMS_{i+1}$ outputs, resepectively. The multiplexers 28 and 32 each pass the test vector at the $TDO_{i-1}$ and at the $TDI_i$ inputs to the $TDO_i$ and $TDO_{i+1}$ outputs, respectively. As can be appreciated, during operation in the uni-ring controller bypass mode, the test system 10 operates in the same scan path with at least its upstream and downstream neighbors as seen in FIG. 9. However, the controller 22 remains bypassed. For this reason, this mode has been named as the uni-ring controller bypass mode.

Figure 7:
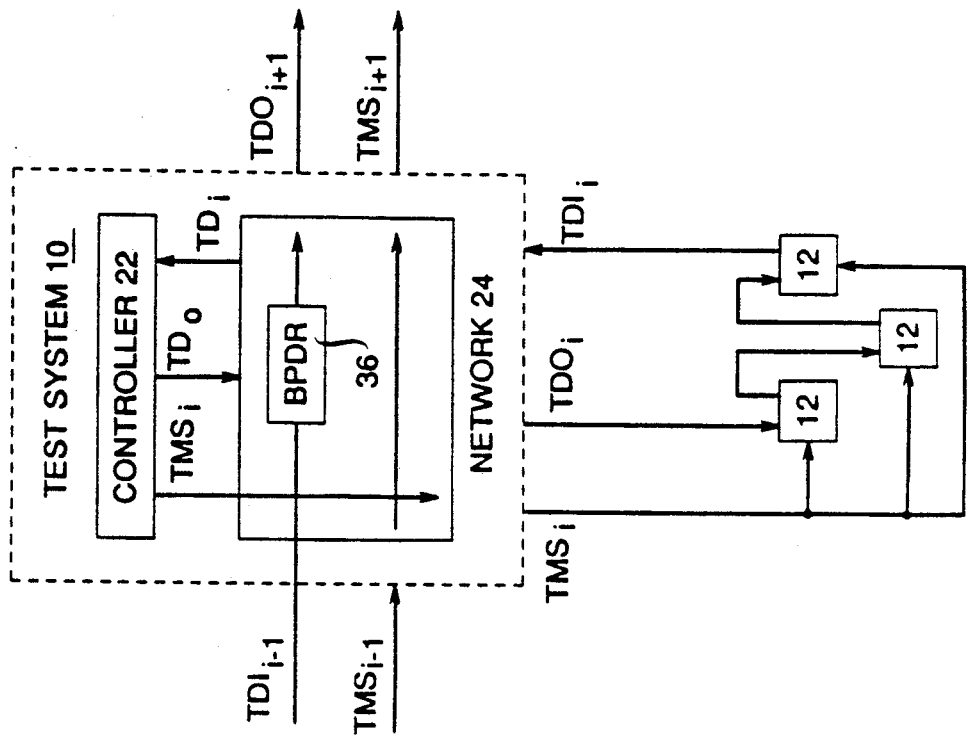

FIG. 7 shows the operation of the test system 10 in the "uni-ring board bypass" mode. During operation in this mode, the TMS signal and the test vector received at the $TMS_{i-1}$ and $TDI_{i-1}$ inputs of the test system 10 from the one upstream therefrom pass through the network 24 to the $TMS_{i+1}$ and $TDO_{i+1}$ outputs, respectively, of the test system for transmission to the one immediately downstream therefrom. No test vector $TD_o$ passes from the controller 22 or from the upstream test system to the chain of circuits 12.

Referring to FIG. 1, to accomplish operation of the test system 10 in the uni-ring board bypass mode, the bits c1 and c2 of the control signal FC are set to logic high and logic low levels, respectively. When the bits c1 and c2 are set at these levels, the multiplexers 30 and 32 pass the signals at the $TDI_{i-1}$ and $TMS_{i-1}$ inputs of the test system 10 to the $TDO_{i+1}$ output (through the bypass data register 36) and to the $TMS_{i+1}$ output, respectively. Although the multiplexers 28 and 34 are operative to pass the test vector from the $TDI_{i-1}$ input of the test system 10 to the boundary scan chain of integrated circuits 12, and to pass the shifted-out test vector $TD_i$ from the boundary scan circuit chain to the controller 22, respectively, the input test vector and the shifted-out test vector are ignored. Since the test vector and test mode select signals input to the $TDI_{i-1}$ and $TMS_{i-1}$ inputs, respectively, of the test system 10 pass directly to the $TDO_{i+1}$ and $TMS_{i+1}$ outputs, respectively, without affecting the chain of circuits 12 during this time, this mode of operation is appropriately described as the uni-ring board bypass mode.

The foregoing describes a test system 10 which can selectively test a single circuit 12 in a scan path (multi-ring mode operation) or can be coupled with a plurality of other test systems to test a plurality of circuits in a larger scan path (uni-ring mode operation).

A distinct advantage of the present test system is the ability to allow for rapid test and diagnosis. To detect a faulty connection between a set of the circuit boards 14 and a backplane (not shown), the test system 10 associated with a particular circuit board 13 is placed in the uni-ring transceiver mode as per FIG. 5. The test system 10 associated with each remaining circuit board 13 would be operated in the uni-ring controller bypass mode as per FIG. 6. The boundary scan chain of integrated circuits 12 on each circuit board 14 will now be daisy chained with those on the other boards in one long path as seen in FIG. 9. At the same time, the boundary scan chains of circuits 12 remain sychronized, since each continues to receive the clock signal TCK from its own test system.

Another advantage of the present invention is that each test system 10 can operate independently of the others (in the multi-ring mode) as per FIG. 4, so that concurrent testing of the chain of circuits 12 on each circuit board 13 may be achieved.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A test system associated with a circuit board for testing the board by supplying a test data signal thereto and then capturing for analysis the response signal generated by the board following receipt of the test data signal, comprising:

controller means for generating a test data signal for input to a circuit board and for capturing a response signal generated by the board following receipt of the test data signal, said controller means also generating a flow control signal for controlling the passage of signals between the circuit board and the controller means; and network means coupled between the controller means and the circuit board and responsive to the flow control signal for selectively passing the test data signal from the controller means, or from another test system associated with another circuit board, to the circuit board or from the other test system to a second other test system and for selectively passing the response signal from the circuit board either to the controller means or to another test system.

2. The system according to claim 1 wherein said network means comprises:

a first multiplexer having a first input coupled to receive the test data signal from the controller means and having a second input coupled to receive the test data signal from a first other test system, the multiplexer being responsive to the flow control signal from the controller means for selectively passing the signal at one of its first and second inputs to the circuit board;

a second multiplexer having a first input coupled to receive the response signal generated by the circuit board, and a second input coupled to receive the test data signal generated by the first other test system, the second multiplexer being responsive to the flow control signal from the controller means for selectively passing the signal received at its first and second inputs to the controller means for capture thereby; and a third multiplexer having a first input coupled to receive the test data signal from the first other test system, and a second input coupled to receive the response signal from the circuit board, the third multiplexer being responsive to the flow control signal from the controller means for selectively passing the signal received at its first and second inputs to a second other test system.

3. The system according to claim 2 wherein a bypass data register is interposed between the first other test system and the first input of the third multiplexer.

4. The system according to claim 1 wherein the controller means includes a test data generator comprised of;

a first memory for storing a predetermined set of signals;

a second memory containing information descriptive of the circuit board;

an automatic test pattern generator for generating a test data signal in accordance with at least one algorithm; and a multiplexer responsvie to the information contained in the first memory for selectively passing test data from a separate one of the first memory and the automatic test pattern generator to the circuit board.

5. The system according to claim 4 wherein the automatic test pattern generator comprises:

a first module for generating a test data signal consisting of a successive set of vectors, which, when arrayed in matrix form, exhibits a diagonal of all ones;

a second module for generating a test data signal consisting of successive vectors which increase monotonically;

a third module for generating a test data signal consisting of successive vectors each of whose bits are pseudorandomly generated;

a fourth module for generating a test data signal consisting of a successive vectors whose bits are all ones; and a multiplexer having a first, second, third and fourth input supplied with the test data signal produced by a separate one of the first, second, third and fourth modules, respectively, the multiplexer being responsive to an externally supplied mode select signal for selectively passing the signal at a separate one of its inputs to its output.

6. A system associated with a circuit board for testing the board by supplying a test mode select signal thereto to cause the board to operate in a test mode and a test data input signal, which upon receipt, causes the board to produce a response signal for capture by the system, comprising:

controller means for generating a test mode select signal to cause a circuit board to operate in a test mode, a test data signal, which, when the circuit board is operating in the test mode, causes the board to produce a response signal for capture by the controller means, and a flow control signal for controlling the passage of the test mode select and the test data signals to the circuit board and the passage of the response signals from the circuit board to the controller means; and network means coupled between the controller means and the circuit board and responsive to the flow control signal for selectively passing, to the circuit board, the test mode select signal and the test data signal from the controller means, or a test mode select and test data signal from another test system associated with another circuit board and for selectively passing, from the circuit board, the response signal either to the controller means or to another test system associated with another circuit board.

7. A system according to claim 6 wherein the network means comprises:

a first multiplexer having a first input coupled to receive the test data signal from the controller and having a second input coupled to receive the test data signal from a first other test system, the multiplexer being responsive to the flow control signal from the controller for selectively passing a separate one of the signals received at first and second multiplexer inputs to the circuit board;

a second multiplexer having a first input coupled to receive the test mode select signal from the controller and having a second input coupled to receive a test mode select signal from the first other test system, the second multiplexer being responsive to the flow control signal from the controller for passing a separate one of the signals received at the first and second inputs to the circuit board;

a third multiplexer having a first input coupled to receive the test mode select signal from the first other test system and having a second input coupled to receive the test mode select signal from the controller, the third multiplexer being responsive to the flow control signal from the controller for passing a separate one of the signals received at the first and second inputs to a second other test system;

a fourth multiplexer having a fist input coupled to receive the test data signal from another test system and having a second input coupled to receive the response signal from the circuit board, the fourth multiplexer being responsive to the flow control signal from the controller to selectively pass the signal at the first and second input to the second other test system; and a fifth multiplexer having a first input coupled to receive the test data signal from the first other test system and having a second input coupled to the circuit board to receive the response signal therefrom, the fifth multiplexer being responsive to the flow control signal from the controller to pass a separate one of the signals received at the first and second inputs to the controller.

8. The system according to claim 6 wherein the controller means comprises:

a test data generator for generating test data signals;
a test data receiver for receiving response signals; and
means for providing control information to the test generator and test data receiver.

9. The system according to claim 8 wherein the test data generator comprises:

a first memory for storing a predetermined set of signals;

a second memory containing an information description of the circuit board;

an automatic test pattern generator for generating a test data signal in accordance with at least one algorithm; and a multiplexer responsive to the information contained in the first memory for selectively passing test data from a separate one of the first memory and the automatic test pattern generator.

10. The system according to claim 9 wherein the automatic test pattern generator comprises:

a first module for generating a test data signal consisting of successive vectors, which, when arrayed in matrix form, yield a diagonal of all ones;

a second module for generating a test data signal consisting of successive vectors which increase monotonically;

a third module for generating a test data signal consisting of successive vectors whose bits are pseudorandomly generated;

a fourth module for generating a test data signal consisting of successive vectors whose bits are all ones; and a multiplexer having a first, second, third and fourth input supplied with the test data signal produced by a separate one of the first, second, third and fourth modules, respectively, the multiplexer being responsive to an externally supplied mode select signal for selectively passing the signal at a separate one of its inputs to its output.

11. A plurality of test systems, each operative to selectively test a circuit board associated therewith independently of the other test systems, and to cooperatively test the circuit boards together, each system comprising:

controller means for generating a test data signal for input to a circuit board and for capturing a response signal generated by a board following receipt of the test data signal, said controller means also generating a flow control signal for controlling the passage of signals to and from the circuit board associated with the individual test system, and network means coupled between the controller means and the circuit board associated with the test system for selectively passing to the associated circuit board, the test data signal from the controller means, or the controller of another test system associated with another circuit board or from the other test system to a second other test system, in response to the flow control signal, and for selectively passing the response signal generated by the circuit board associated with the test system, or from a circuit board associated with another test system, to the controller means.

12. The system according to claim 11 wherein said network means comprises:

a first multiplexer having a first input coupled to receive the test data signal from the controller means and having a second input coupled to receive the test data signal from the controller of another test system, the multiplexer being responsive to the flow control signal from the controller means for selectively passing the signal at one of its first and second inputs to the circuit board;

a second multiplexer having a first input coupled to receive the response signal generated by the circuit board, and a second input coupled to receive the test data signal generated by the other test system, the second multiplexer being responsive to the flow control signal from its corresponding controller means for selectively passing the signal received at its first and second inputs to its associated controller means for capture thereby; and a third multiplexer having a first input coupled to receive the test data signal from the other test system, and a second input coupled to receive the response signal from the circuit board, the third multiplexer being responsive to the flow control signal from the controller means for selectively passing the signal received at its first and second inputs to a second other test system.

13. The system according to claim 12 wherein a bypass data register is interposed between the external signal source and the first input of the third multiplexer.

14. A system for supplying at least one test vector to a serially connected chain of elements to avoid potential conflicts between elements, comprising:

a first memory for storing a map of the elements which identifies those in potential conflict with each other;

a second memory which stores at least one test vector whose bits each correspond to a separate one of the elements, each bit of the vector being selected such that when each is applied to its corresponding element, no actual conflicts arise between elements in potential conflict with each other;

an automatic test pattern generator for generating at least one test vector in accordance with a predetermined algorithm; and a control gate responsive to the map contained in the first memory for selectively passing a successive one of the bits of the vector stored in the second memory to each of the elements identified as being in potential conflict with each other and for selectively passing the vector generated by the automatic test pattern generator to the elements not identified as being in conflict with each other.

15. The system according to claim 14 wherein the automatic test pattern generator comprises:

a first module for generating successive test vectors, which, when arrayed in matrix form, have a diagonal of all ones;

a second module for generating successive test vectors which increase monotonically;

a third module for generating successive vectors whose bits are pseudorandomly generated;

a fourth module for generating successive test vectors whose bits are all ones; and a multiplexer having a first, second, third and fourth input supplied with the test data signal produced by a separate one of the first, second, third and fourth modules, respectively, the multiplexer being responsive to an externally supplied mode select signal for selectively passing the signal at a separate one of its inputs to its output.

16. A method for testing circuit boards by applying a test signal thereto and capturing, for analysis, a response signal generated thereby following receipt of the test signal comprising the steps of:

generating at least one test signal;

generating a flow control signal for controlling the passage of test signals to the board and the passage of response signals therefrom; and selectively routing test signals to, and response signals from, each circuit board in response to the flow control such that the response signal of each circuit board is routed as the test signal to a successive circuit board.

17. A method for generating at least one test vector whose bits, when successively shifted into a chain of serially connected elements, cause no conflicts between elements in potential conflict with each other, the method comprising the steps of:

storing at least one test vector whose bits are selected such that, when each bit which is shifted into an element in potential conflict with another, no conflict in fact arises;

storing information indicative of which of the serially connected elements is in potential conflict from each other;

generating at least one test vector whose bits are determined in accordance with a preselected algorithm; and selectively shifting a bit from a separate one of the stored test vectors and the generated test vector to each successive element in the chain, depending on whether the element is identified as being in potential conflict with another element.

18. The method according to claim 17 wherein each of the bits of the generated test vector is pseudorandomly generated.

19. The method according to claim 17 wherein each of the bits of the generated test vector is a "one."

20. The method according to claim 17 wherein successive test vectors are generated such that when arrayed in a matrix, the diagonal will be all ones.

21. The method according to claim 17 wherein successive test vectors are generated which increase monotonically.

* * * * *